(12) United States Patent
Misaki

(10) Patent No.: US 12,464,872 B2
(45) Date of Patent: Nov. 4, 2025

(54) LIGHT EMITTING ELEMENT

(71) Applicant: NICHIA CORPORATION, Anan (JP)

(72) Inventor: Takao Misaki, Anan (JP)

(73) Assignee: NICHIA CORPORATION, Anan (JP)

( * ) Notice: Subject to any disclaimer, the term of this patent is extended or adjusted under 35 U.S.C. 154(b) by 843 days.

(21) Appl. No.: 17/691,814

(22) Filed: Mar. 10, 2022

(65) Prior Publication Data

US 2022/0293838 A1    Sep. 15, 2022

(30) Foreign Application Priority Data

Mar. 12, 2021 (JP) ................. 2021-040802

(51) Int. Cl.
*H10H 20/857* (2025.01)
*H10H 20/821* (2025.01)
(Continued)

(52) U.S. Cl.
CPC ........ *H10H 20/857* (2025.01); *H10H 20/821* (2025.01); *H10H 20/831* (2025.01);
(Continued)

(58) Field of Classification Search
CPC ......... H01L 33/62; H01L 33/24; H01L 33/38; H01L 33/405; H01L 33/44; H01L 33/60; H01L 33/50; H01L 33/385; H10H 20/857; H10H 20/821; H10H 20/831; H10H 20/835; H10H 20/84; H10H 20/856; H10H 20/851; H10H 20/8314
See application file for complete search history.

(56) References Cited

U.S. PATENT DOCUMENTS

2002/0047128 A1* 4/2002 Song .................. H01L 33/42
                                                          257/89
2002/0130327 A1* 9/2002 Wu ................... H01L 33/385
                                                          257/80
(Continued)

FOREIGN PATENT DOCUMENTS

CN      203503689 U    3/2014
CN      108110117 A    6/2018
(Continued)

*Primary Examiner* — William B Partridge
*Assistant Examiner* — Linda J. Fleck
(74) *Attorney, Agent, or Firm* — Foley & Lardner LLP

(57) ABSTRACT

A light emitting element includes: a semiconductor stack structure including: a first semiconductor layer of a first conductivity type, which, in a top plan view, has a first portion, and a second portion within the first portion, a second semiconductor layer of a second conductivity type disposed on the second portion, and an active layer. The first portion has a peripheral portion positioned at a periphery of the second portion, and a plurality of extended portions extending from the peripheral portion towards the second portion in a top plan view. An insulation layer covers the semiconductor stack structure and has first through holes in the extended portions and a second through hole above the second semiconductor layer. A first electrode is electrically connected to the first semiconductor layer at the first through holes. A second electrode is electrically connected to the second semiconductor layer at the second through hole.

17 Claims, 5 Drawing Sheets

(51) Int. Cl.
*H10H 20/831* (2025.01)
*H10H 20/832* (2025.01)
*H10H 20/84* (2025.01)
*H10H 20/856* (2025.01)

(52) U.S. Cl.
CPC .......... *H10H 20/835* (2025.01); *H10H 20/84* (2025.01); *H10H 20/856* (2025.01)

(56) References Cited

U.S. PATENT DOCUMENTS

| | | |
|---|---|---|
| 2005/0056855 A1 | 3/2005 | Lin et al. |
| 2005/0211989 A1 | 9/2005 | Horio et al. |
| 2006/0001035 A1 | 1/2006 | Suehiro et al. |
| 2008/0096297 A1 | 4/2008 | Schiaffino et al. |
| 2015/0311415 A1* | 10/2015 | Song .................... H01L 27/156 438/46 |
| 2018/0151780 A1* | 5/2018 | Jang ..................... H10H 20/814 |
| 2019/0259915 A1 | 8/2019 | Nakamura et al. |
| 2019/0267527 A1* | 8/2019 | Emura .................. H01L 27/156 |
| 2020/0044116 A1* | 2/2020 | Chen .................... H10H 20/853 |
| 2020/0044128 A1 | 2/2020 | Miki et al. |
| 2022/0376140 A1* | 11/2022 | Misaki ................... H01L 33/62 |

FOREIGN PATENT DOCUMENTS

| | | | |
|---|---|---|---|
| CN | 110165033 | A | 8/2019 |
| CN | 110797443 | A | 2/2020 |
| JP | 2005-093970 | A | 4/2005 |
| JP | 2005-302747 | A | 10/2005 |
| JP | 2006-012916 | A | 1/2006 |
| JP | 2009-188422 | A | 8/2009 |
| JP | 2010-507246 | A | 3/2010 |
| JP | 2014-022608 | A | 2/2014 |
| JP | 2016-032009 | A | 3/2016 |
| JP | 2020-021785 | A | 2/2020 |
| JP | 2020-043375 | A | 3/2020 |
| JP | 2020-065037 | A | 4/2020 |

* cited by examiner

LIGHT EMITTING ELEMENT

CROSS-REFERENCE TO RELATED APPLICATIONS

This application is based upon and claims the benefit of priority from the prior Japanese Patent Application No. 2021-040802, filed on Mar. 12, 2021, the entire contents of which are incorporated herein by reference.

BACKGROUND

The present disclosure relates to a light emitting element.

Japanese Patent Publication No. 2014-22608 discloses a light emitting element in which an insulation layer having an opening is disposed on and covering the p-side semiconductor layer that is disposed on the n-side semiconductor layer, and an n-side electrode is disposed in the opening of the insulation layer for electrical communication with the n-side semiconductor layer.

SUMMARY

There is a need to improve the emission distribution of such a light emitting element.

A light emitting element according to one embodiment of the present invention includes: a semiconductor stack structure having a first semiconductor layer of a first conductivity type which has a first portion, a second portion positioned in the first portion, and a quadrangular top plan view shape including a first side, a second side connected to the first side, a third side connected to the second side, and a fourth side connected to the first and third sides, a second semiconductor layer of a second conductivity type disposed on the second portion, and an active layer disposed between the first semiconductor layer and the second semiconductor layer, wherein the first portion has a peripheral portion positioned at the periphery of the second portion and a plurality of extended portions individually opposing the first side, the second side, the third side, and the fourth side, each extending from the peripheral portion towards the second portion in a top plan view; an insulation layer covering the semiconductor stack structure and having first through holes individually positioned in the extended portions and a second through hole positioned above the second semiconductor layer; a first electrode disposed on the second semiconductor layer via the insulation layer and electrically connected to the first semiconductor layer at the first through holes; a second electrode electrically connected to the second semiconductor layer at the second through hole; a first external connection part disposed on the first electrode positioned above the second semiconductor layer and electrically connected to the first electrode; and a second external connection part disposed on the second electrode and electrically connected to the second electrode, wherein in a top plan view, the second semiconductor layer includes four regions defined by two imaginary lines, a first imaginary line being orthogonal to and halving the first side and a second imaginary line being orthogonal to and halving the second side, and the four regions include a first region in which the first external connection part is disposed, a second region adjacent to the first region in a first direction parallel to the second side, a third region adjacent to the first region in a second direction parallel to the first side, and a fourth region adjacent to the second region in the second direction in which the second external connection part is disposed.

According to a light emitting element of an embodiment of the present invention, a light emitting element with improved emission distribution can be provided.

DETAILED DESCRIPTION

Figure 1:
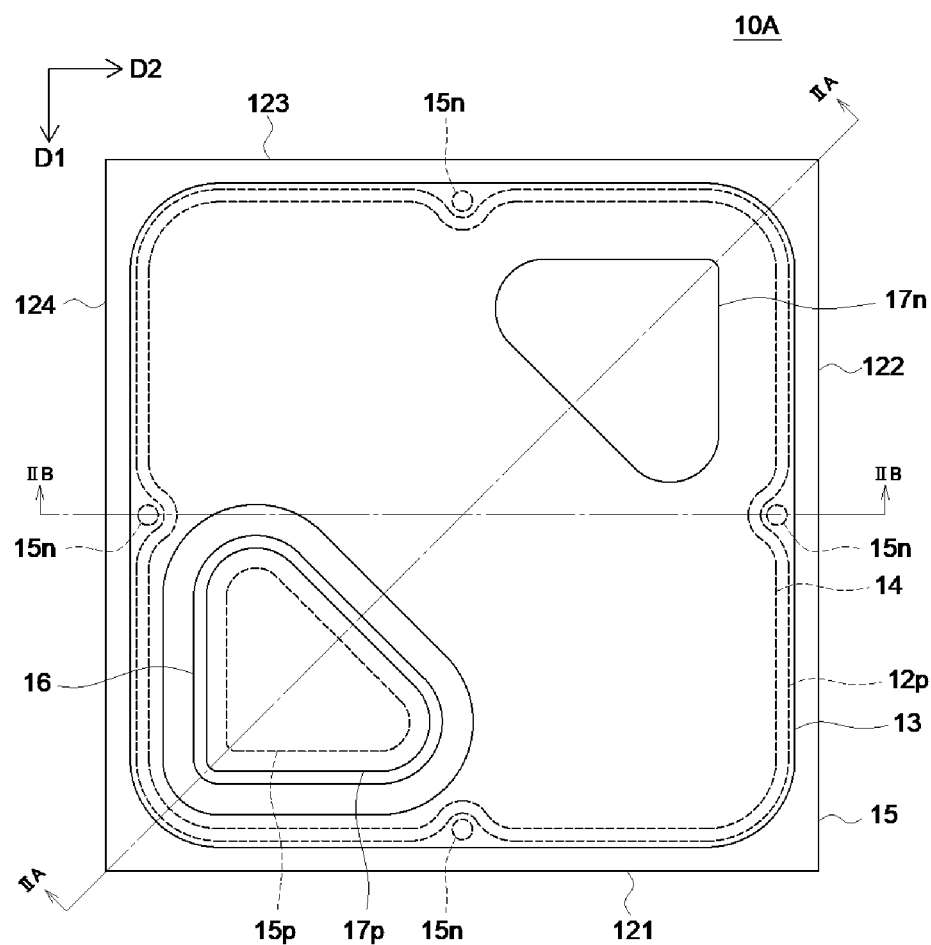
FIG. 1 is a schematic top plan view of a light emitting element according to one embodiment of the present invention.

Light emitting elements according to certain embodiments of the present invention will be explained below.

The drawings referenced in the explanation below are schematic illustrations of the present invention. As such, the scale, spacing, or positional relationship of the members might be exaggerated, or a portion of a member omitted. Moreover, the scale or spacing of the members may not be consistent between a top plan view and a cross-sectional view. In the description below, the same designations and reference numerals basically denote the same or similar members, and a repeated detailed explanation will be omitted as appropriate.

In the present specification, terms such as "upper" or "lower" are used to indicate the relative positions of the constituent elements in the drawings referenced for the explanation purposes, and are not intended to indicate the absolute positions unless otherwise specifically noted.

Figure 2A:
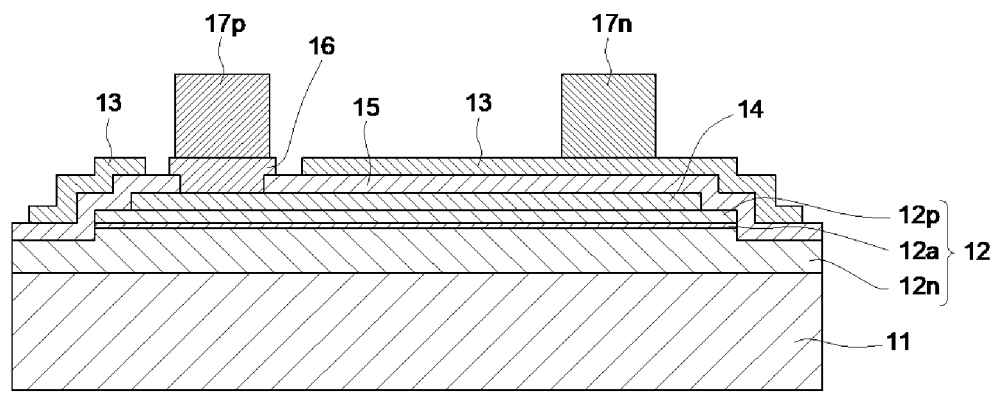
FIG. 2A is a schematic cross-sectional view taken along line IIA-IIA in FIG. 1.
Figure 2B:
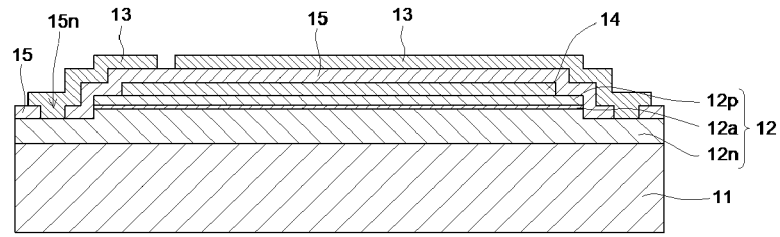
FIG. 2B is a schematic cross-sectional view taken along line IIB-IIB in FIG. 1.
Figure 2C:
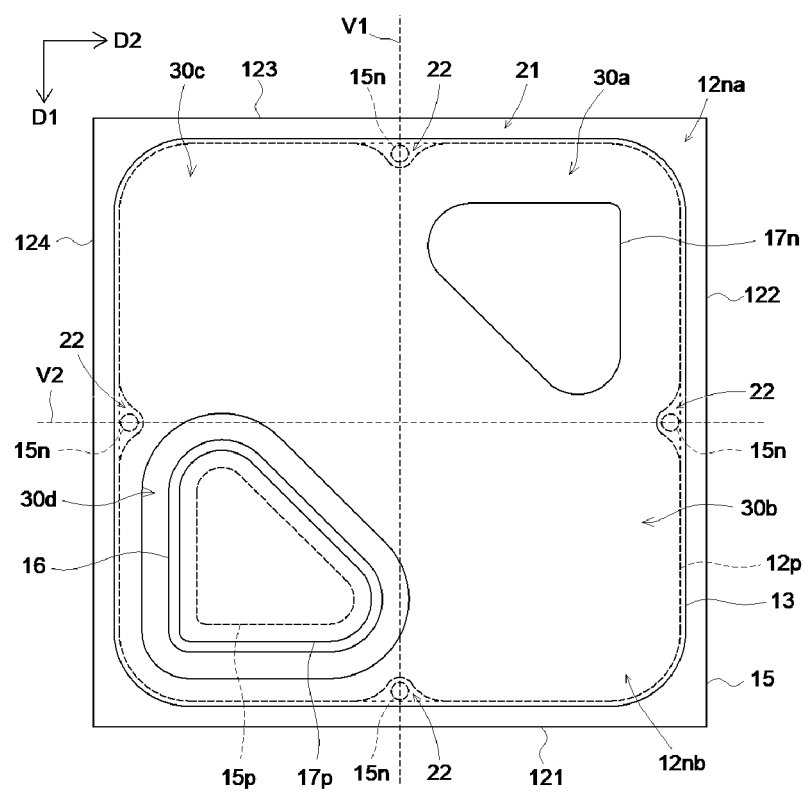
FIG. 2C is a schematic top plan view of a light emitting element according to an embodiment of the present invention.
Figure 2D:
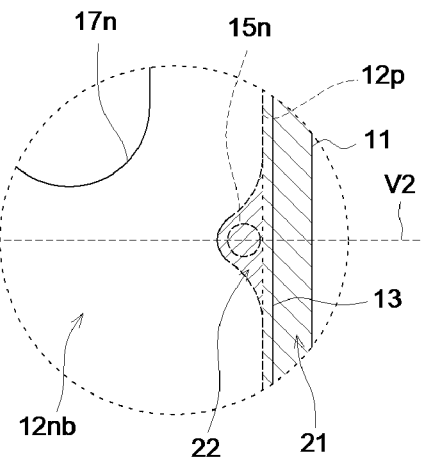
FIG. 2D is a schematic top plan view enlarging a portion in FIG. 2C.

A light emitting element 10A will be explained with reference to FIG. 1, FIG. 2A, FIG. 2B, and FIG. 2C. FIG. 1 is a schematic top plan view explaining how the light emitting element 10A is constructed in detail. The cross-sectional view in FIG. 2A is a schematic representation of the cross section taken along line IIA-IIA in FIG. 1. The cross-sectional view in FIG. 2B is a schematic representation of the cross section taken along line IIB-IIB in FIG. 1. FIG. 2C is a schematic top plan view explaining the construction of the light emitting element 10A in detail. FIG. 2D is an enlarged view of a portion of FIG. 2C.

Each constituent of the light emitting element 10A will be successively explained with reference to FIG. 1 and FIG. 2A to FIG. 2D.

The light emitting element 10A includes a semiconductor stack structure 12 which includes a first semiconductor layer 12n, a second semiconductor layer 12p, and an active layer 12a disposed between the first semiconductor layer 12n and the second semiconductor layer 12p, an insulation layer 15, a first electrode 13, a second electrode 16, a first external connection part 17n, and a second external connection part 17p. The semiconductor stack structure 12 is disposed on a substrate 11. A light reflecting electrode 14 is disposed on a portion of the upper face of the second semiconductor layer 12p. The first external connection part 17n is disposed on the first electrode 13. The second external connection part 17p is disposed on the second electrode 16. An electric current is supplied between the first electrode 13 and the second electrode 16 via the first external connection part 17n and the second external connection part 17p. Once the electric current is supplied between the first electrode 13 and the second electrode 16, the active layer 12a of the light emitting element 10A emits light. The light emitted by the active layer 12a of the light emitting element 10A propagates through the semiconductor stack structure 12 to be extracted from the lower face or the lateral faces of the substrate 11.

Substrate 11

A substrate 11 can be made of any substrate material that allows a semiconductor to be epitaxially grown. For the substrate 11, for example, a substrate made of a material, such as sapphire, gallium nitride, or the like, is used. In this embodiment, a sapphire substrate having light transmissivity is preferably used from the perspective of improving the light extraction efficiency of the light emitting element 10A. The top plan view shape of the substrate 11 is, for example, quadrangular. In this embodiment, the top plan view shape of the substrate 11 is a square. The length of each side of the substrate 11 is, for example, 100 μm to 1500 μm, preferably 100 μm to 500 μm.

Semiconductor Stack Structure 12

A semiconductor stack structure 12 is a stack structure formed on a substrate 11 that includes from the substrate 11 side, a first semiconductor layer 12n of a first conductivity type, an active layer 12a, and a second semiconductor layer 12p of a second conductivity type in that order. In this embodiment, the first conductivity type is an n-type, and the second conductivity type is a p-type. For the first semiconductor layer 12n, the active layer 12a, and the second conductor layer 12p, a semiconductor such as $In_XAl_YGa_{1-X-Y}N$ ($0 \le X$, $0 \le Y$, $X+Y<1$) or the like can be suitably used. Each of these semiconductor layers may be of a single layer structure, a stack structure having multiple layers of different compositions and thicknesses, or a superlattice structure. Particularly, the active layer 12a is preferably of a single quantum well or multiple quantum well structure in which thin layers are stacked to generate a quantum effect. The semiconductor layers can be doped with an n-type impurity, such as Si, Ge, or the like, and/or a p-type impurity, such as Mg, Zn, or the like. The first semiconductor layer 12n includes, for example, a semiconductor layer doped with an n-type impurity. The second semiconductor layer 12p includes, for example, a semiconductor layer doped with a p-type impurity.

As shown in FIG. 1 and FIG. 2C, the first semiconductor layer 12n in a top plan view has a first portion 12na and a second portion 12nb located in the first portion 12na. In the first portion 12na, no active layer 12a or second semiconductor layer 12p is disposed, and the first semiconductor layer 12n is exposed from the active layer 12a and the second semiconductor layer 12p. The second semiconductor layer 12p is disposed in the second portion 12nb. The active layer 12a is disposed between the second portion 12nb and the second semiconductor layer 12p. The active layer 12a is disposed on the second portion 12nb, and the second semiconductor layer 12p is disposed on the active layer 12a.

The top plan view shape of the first semiconductor layer 12n is, for example, quadrangular. In this embodiment, the top plan view shape of the first semiconductor layer 12n is a square. As shown in FIG. 1, the first semiconductor layer 12n includes a first side 121, a second side 122 connected to the first side 121, a third side 123 connected to the second side 122, and a fourth side 124 connected to the first side 121 and the third side 123. The length of each side of the first semiconductor layer 12n is, for example, in a range of 100 μm to 500 μm. Here, the direction parallel to the second side 122 and the fourth side 124 is defined as the first direction D1, and the direction parallel to the first side 121 and the third side 123 is defined as the second direction D2.

As shown in FIG. 1, FIG. 2C, and FIG. 2D, in a top plan view, the first portion 12na includes a peripheral portion 21 positioned at the periphery of the second portion 12nb, and a plurality of extended portions 22 extending from the peripheral portion 21 to the second portion 12nb, individually opposing the first side 121, the second side 122, the third side 123, and the fourth side 124. In this embodiment, an extended portion 22 is provided to oppose each of the first side 121, the second side 122, the third side 123, and the fourth side 124. Multiple extended portions 22 may be disposed to oppose each of the first side 121, the second side 122, the third side 123, and the fourth side 124. As shown in FIG. 2C, in a top plan view, the extended portions 22 are positioned on the first imaginary line V1 orthogonal to and halving the first side 121 or the second imaginary line V2 orthogonal to and halving the second side 122. This can reduce the current density distribution variation in the light emitting element 10A, thereby improving the emission distribution. In FIG. 2D, the region marked with hatched lines rising diagonally to the left is the peripheral portion 21, and the region marked with hatched lines rising diagonally to the right is an extended portion 22. In a top plan view, each of the first through holes 15n is positioned in an extended portion 22. The extended portions 22 do not have to be positioned on the first imaginary line V1 or the second imaginary line V2.

The length of the peripheral portion 21 on the first imaginary line V1 is, for example, 15 μm to 25 μm. The length of an extended portion 22 on the first imaginary line V1 is, for example, 10 μm to 20 μm. The maximum length of an extended portion 22 in the first direction D1 is, for example, 35 μm to 70 μm.

Light Reflecting Electrode 14

A light reflecting electrode 14, as shown in FIG. 2A and FIG. 2B, is disposed on the upper face of the second semiconductor layer 12p. The light reflecting electrode 14 is electrically connected to the second semiconductor layer 12p.

The light reflecting electrode 14 can diffuse the electric current supplied via the second electrode 16 to the second semiconductor layer 12p. The light reflecting electrode 14 preferably has high light reflectivity with respect to the light from the active layer 12a. The light reflecting electrode 14 preferably has a reflectance, for example, of at least 70%, preferably at least 80%, with respect to the light from the active layer 12a. For the light reflecting electrode 14, a metal material having good conductivity and reflectivity can be used. For the metal material used for the light reflecting electrode 14, for example, Ag, Al, Ni, Ti, Pt, Ta, Ru, or an alloy made of these metals as main components can be suitably used. For the light reflecting electrode 14, furthermore, these metal materials can be used as a single layer or a stack of layers. The thickness of the light reflecting electrode 14 can be set, for example, in a range of 300 nm to 1 μm.

Insulation Layer 15

As shown in FIG. 1, FIG. 2A, and FIG. 2B, an insulation layer 15 is disposed to cover the semiconductor stack structure 12. The insulation layer 15 covers the surface of the semiconductor stack structure 12 and the surface of the light reflecting electrode 14. The insulation layer 15, disposed between the light reflecting electrode 14 and the first electrode 13, has the function of preventing the light reflecting electrode 14 from being electrically connected to the first electrode 13. The insulation layer 15 has first through holes 15n individually positioned on the extended portions 22, and a second through hole 15p positioned on the second semiconductor layer 12p. The first electrode 13 is electrically connected to the extended portions 22 at the first through holes 15n. The second electrode 16 is electrically connected to the second semiconductor layer 12p at the second through hole 15p.

For the insulation layer 15, a metal oxide or metal nitride can be used. For the insulation layer 15, for example, an oxide or a nitride containing at least one material selected from the group consisting of Si, Ti, Zr, Nb, Ta, and Al can be suitably used. For the insulation layer 15, for example, $SiO_2$, SiN, or the like is used. For the insulation layer 15, a single layer or a stack of layers of these metal oxides or metal nitrides can be used. The insulation layer 15 may be constructed with a DBR (distributed Bragg reflector) by using two or more dielectric layers of different refractive indices.

The size of a first through hole 15n can be suitably set in accordance with the size of an extended portion 22. In the case in which the top plan view shape of a first through hole 15n is circular, for example, the diameter of the first through hole 15n can be set to be in a range of 60% to 80% of the length of an extended portion 22 on the first imaginary line V1 described above. The diameter of a first through hole 15n can be set, for example, as 5 μm to 20 μm. Making the diameter of a first through hole 15n small can reduce the size of an extended portion 22 which can reduce the region subject to a partial removal of the active layer 12a and the like, thereby lessening the light emitting region reduction. Making the diameter of a first through hole 15n large can increase the contact area between the first electrode 13 and the first semiconductor layer 12n, thereby lessening the forward voltage Vf increase.

First Electrode 13 and Second Electrode 16

As shown in FIG. 1 and FIGS. 2A to 2C, a first electrode 13 is disposed on the second semiconductor layer 12p via the insulation layer 15. The first electrode 13 is disposed on the insulation layer 15 disposed on the light reflecting electrode 14 and on the insulation layer 15 disposed on the first portion 12na. In this embodiment, the first electrode 13 is electrically connected to the first semiconductor layer 12n only at the extended portions 22. In other words, the first electrode 13 is not electrically connected to the second portion 12nb of the first semiconductor layer 12n. This can secure a large area for the active layer 12a while making the top plan view shape of the active layer 12a substantially quadrangular, thereby improving the emission distribution. The first electrode 13 may be electrically connected to the second portion 12nb to the extent that the emission distribution is not degraded. For example, the first electrode 13 may be electrically connected to the central portion of the first semiconductor layer 12n.

A second electrode 16 is disposed in the second through hole 15p and is electrically connected to the light reflecting electrode 14. The second electrode 16 is in electrical communication with the second semiconductor layer 12p via the light reflecting electrode 14. The second electrode 16 is surrounded by the first electrode 13 in a top plan view. The second electrode 16 is disposed so as not to overlap the first electrode 13 in a top plan view.

For the first electrode 13 and the second electrode 16, a metal material can be used. For example, a metal, such as Ag, Al, Ni, Rh, Au, Cu, Ti, Pt, Pd, Mo, Cr, or W can be singly used, or an alloy having these metals as main components can be suitably used. In the case of employing an alloy, for example, one containing a non-metal element such as Si as in AlSiCu may be used. The first electrode 13 and the second electrode 16 can be made of a single layer or a stack of layers of these metal materials. In this embodiment, the first electrode 13 and the second electrode 16 each have a stack structure made of same material. First External Connection Part 17n and Second External Connection Part 17p As shown in FIG. 1, FIG. 2A, and FIG. 2B, a first external connection part 17n is disposed on the first electrode 13 positioned on the second semiconductor layer 12p, and is electrically connected to the first electrode 13. A second external connection part 17p, as shown in FIG. 1, FIG. 2A, and FIG. 2B, is disposed on the second electrode 16, and is electrically connected to the second electrode 16.

As shown in FIG. 2C, the second semiconductor layer 12p includes four regions defined by the first imaginary line V1 and the second imaginary line V2 in a top plan view. The four regions include a first region 30a, a second region 30b, a third region 30c, and a fourth region 30d. These regions in a top plan view are each surrounded by the outer edge of the second semiconductor layer 12p, the first imaginary line V1, and the second imaginary line V2. The first region 30a is the region in which the first external connection part 17n is disposed. The second region 30b is adjacent to the first region 30a in the first direction D1. The third region 30c is adjacent to the first region 30a in the second direction D2. The fourth region 30d is adjacent to the second region 30b in the second direction D2 and is the region in which the second external connection part 17p is disposed. The fourth region 30d is adjacent to the third region 30c in the first direction D1.

The first external connection part 17n and the second external connection part 17p are arranged so as not be aligned in the first direction D1. The first external connection part 17n and the second external connection part 17p are arranged so as not be aligned in the second direction D2. The first external connection part 17n and the second external connection part 17p are positioned on a diagonal line of the first semiconductor layer 12n. Arranging the first external connection part 17n and the second external connection part 17p in this manner can increase the distance between the two as compared to the case in which the first external connection part 17n and the second external connection part 17p are arranged to oppose one another in the first direction D1. This can prevent the first external connection part 17n or the second external connection part 17p from straddling two wires of different conductivity types when the first external connection part 17n and the second external connection part 17*p* are bonded to a substrate on which wires are disposed. This can also prevent the first external connection part 17*n* and the second external connection part 17*p* from being electrically connected by a conductive material such as solder when connecting the first external connection part 17*n* and the second external connection part 17*p* to wires by using the conductive member. The shortest distance between the first external connection part 17*n* and the second external connection part 17*p* in a top plan view is preferably set to be, for example, in a range of 30% to 60% of a side of the first semiconductor layer 12*n*, more preferably 40% to 50%. The shortest distance between the first external connection part 17*n* and the second external connection part 17*p* is, for example, 120 μm to 250 μm.

In a top plan view, 90% or more of the first external connection part 17*n* is disposed within the first region 30*a*. In a top plan view, 90% or more of the second external connection part 17*p* is disposed within the fourth region 30*d*. This can prevent the first external connection part 17*n* and the second external connection part 17*p* from becoming close to one another in part, even when a portion of the first external connection part 17*n* or the second external connection part 17*p* is disposed in the second region 30*b* and/or the third region 30*c*. In a top plan view, the first external connection part 17*n* in whole is disposed in the first region 30*a*. In a top plan view, the second external connection part 17*p* in whole is disposed in the fourth region 30*d*. This makes it easier to design the shortest distance between the first external connection part 17*n* and the second external connection part 17*p* to be even smaller.

The top plan view shapes of the first external connection part 17*n* and the second external connection part 17*p* are substantially triangular. In this embodiment, the top plan view shapes of the first external connection part 17*n* and the second external connection part 17*p* are triangles whose corners are rounded. From the perspective of improving the positioning accuracy of the first external connection part 17*n* and the second external connection part 17*p* and the bonding quality with wires, the first external connection part 17*n* and the second external connection part 17*p* preferably have substantially the same size. The area of the first external connection part 17*n* is preferably set to be, for example, in a range of 30% to 70% of the area of the first region 30*a*, more preferably 30% to 50%. The area of the second external connection part 17*p* is preferably set to be, for example, in a range of 30% to 70% of the area of the fourth region 30*d*, more preferably 30% to 50%. Forming the first external connection part 17*n* and the second external connection part 17*p* larger can increase the areas of bonding with the substrate on which wiring is disposed.

In a top plan view, the first external connection part 17*n* and the second external connection part 17*p* each have a straight-line portion that opposes the other. The straight-line portion of the first external connection part 17*n* is substantially parallel to the straight-line portion of the second external connection part 17*p*. The distance between the straight-line portion of the first external connection part 17*n* and the straight-line portion of the second external connection part 17*p* corresponds to the shortest distance between the first external connection part 17*n* and the second external connection part 17*p*. The lengths of the straight-line portions of the first external connection part 17*n* and the second external connection part 17*p* can be set to be, for example, in a range of 20% to 40% of a length of a side of the first semiconductor layer 12*n*. The first external connection part 17*n* and the second external connection part 17*p* having such straight-line portions can provide a region in which the distance between the straight-line portions of the first external connection part 17*n* and the second external connection part 17 is constant. Accordingly, the first external connection part 17*n* and the second external connection part 17*p* do not become closer with one another in any part, thereby reducing the chance of becoming electrically connected when bonded to the substrate.

For the material to be used for the first external connection part 17*n* and the second external connection part 17*p*, a metal, such as Cu, Au, Ni, or the like can be suitably used. For the first external connection part 17*n* and the second external connection part 17*p*, a single layer or a stack of layers of these metal materials can be utilized. The thickness of each of the first external connection part 17*n* and the second external connection part 17*p* can be set, for example, as 30 μm to 70 μm.

As described above, the light emitting element 10A according to this embodiment has a first electrode 13 electrically connected to the extended portions 22 individually disposed on the sides of the first semiconductor layer 12*n*. In addition, the first external connection part 17*n* is disposed in the first region 30*a* and the second external connection part 17*p* is disposed in the fourth region 30*d*. This can improve the emission distribution of the light emitting element 10A while securing a relatively large area for the active layer 12*a*. Furthermore, a relatively large distance secured between the first external connection part 17*n* and the second external connection part 17*p* can prevent the first external connection part 17*n* or the second external connection part 17*p* from straddling two wires of different conductivity types when connected to the substrate on which the wires are disposed.

Light Emitting Device 100A

Figure 3A:
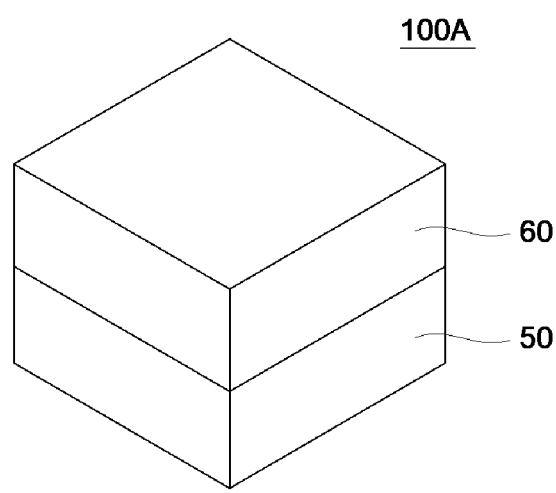
FIG. 3A is a schematic perspective view of a light emitting device which uses a light emitting element according to an embodiment of the present invention.
Figure 3B:
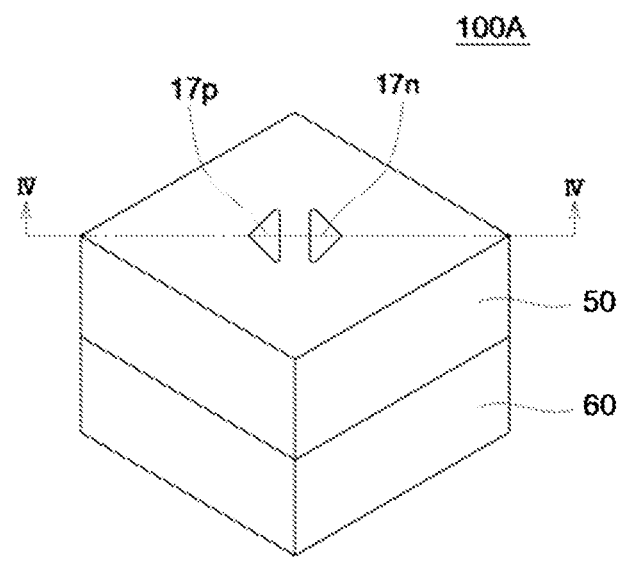
FIG. 3B is a schematic perspective view of a light emitting device which uses a light emitting element according to an embodiment of the present invention.

A light emitting device 100A employing a light emitting element 10A will be explained with reference to FIG. 3A, FIG. 3B, and FIG. 4. FIG. 3A and FIG. 3B are perspective views of the light emitting device 100A. The cross-sectional view in FIG. 4 is a schematic representation of the cross section taken along line IV-IV in FIG. 3B.

Figure 4:
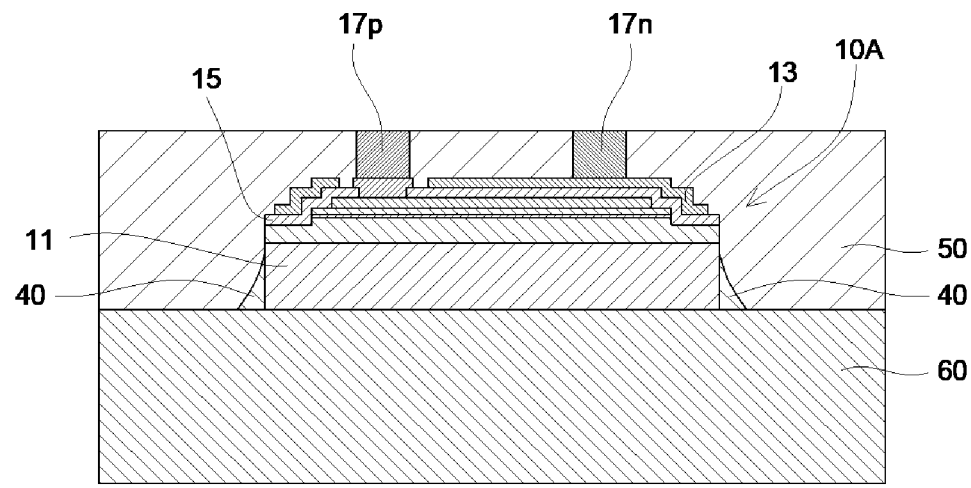
FIG. 4 is a schematic cross-sectional view taken along line IV-IV in FIG. 3B.

The light emitting device 100A employing a light emitting element 10A, as shown in FIG. 3A, FIG. 3B, and FIG. 4, has a light emitting element 10A, a cover member 40 covering the lateral faces of the light emitting element 10A, a first reflecting member 50 covering the lateral faces of the light emitting element 10A and the surface of the cover member 40, and a light transmitting member 60 disposed on the lower face of the substrate 11 of the light emitting element 10A.

Cover Member 40

A cover member 40, as shown in FIG. 4, partly covers the lateral faces of the light emitting element 10A and the upper face of the light transmitting member 60. The cover member 40 covers a portion of each lateral face of the light emitting element 10A. The substrate 11 of the light emitting element 10A is covered by the cover member 40. The cover member 40 has a curved face at the location that is in contact with the first reflecting member 50. Disposing a cover member 40 can improve the light extraction efficiency by allowing the curved face of the cover member 40 to reflect the emitted light from the light emitting element 10A towards the light transmitting member 60.

First Reflecting Member 50

A first reflecting member 50, as shown in FIG. 4, covers the surface of the light emitting element 10A, the curved face of the cover member 40, and the surface of the light transmitting member 60. The first reflecting member 50 covers the lateral faces of the first external connection part 17*n* and the second external connection part 17*p*. In order to secure the surfaces for electrical communication in the first external connection part 17n and the second external connection part 17p, the first reflecting member 50 is disposed so as not to cover a portion of each of the first external connection part 17n and the second external connection part 17p. As shown in FIG. 3B, a portion of each of the first external connection part 17n and the second external connection part 17p is exposed from the first reflecting member 50. The upper face of the first reflecting member 50 and the upper faces of the first external connection part 17n and the second external connection part 17p are positioned in substantially the same plane.

For the first reflecting member 50, for example, a resin or ceramic having light reflectivity is used. For the first reflecting member 50, for example, a resin containing a reflective substance can be used. For the resin, for example, a silicone resin, modified silicone resin, epoxy resin, or the like is used. For the reflective substance, titanium oxide, silicon oxide, alumina, or the like is used. The first reflecting member 50 having light reflectivity can reflect the emitted light from the light emitting element 10A thereby improving the light extraction efficiency. The first reflecting member 50 preferably has a reflectance of, for example, at least 60%, more preferably at least 70% with respect to the emitted light from the light emitting element 10A.

Light Transmitting Member 60

A light transmitting member 60 is disposed on the lower face of the substrate 11 of the light emitting element 10A. The light transmitting member 60 can contain a light reflecting substance, or a phosphor that can convert the wavelength of a portion of the emitted light from the light emitting element 10A. The light transmitting member 60 can be formed by using, for example, a resin, glass, or a ceramic. For the light transmitting member 60 containing a phosphor, for example, a sintered body of a phosphor, a phosphor-containing resin, glass, or ceramic can be used.

For the phosphors to be contained in the light transmitting member 60, those known in the art can be used. For the phosphors to be contained in the light transmitting member 60, for example, yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate based phosphors (e.g., $Ca_8MgSi_4O_{16}Cl_2$:Eu), nitride based phosphors, fluoride based phosphors, phosphors having a Perovskite structure (e.g., $CsPb(F,Cl,Br,I)_3$), quantum dot phosphors (e.g., CdSe, InP, $AgInS_2$ or $AgInSe_2$), and the like can be used. Examples of nitride based phosphors include β-SiAlON based phosphors (e.g., $(Si,Al)_3(O,N)_4$:Eu), α-SiAlON based phosphors (e.g., $Ca(Si,Al)_{12}(O,N)_{16}$:Eu), SLA based phosphors (e.g., $SrLiAl_3N_4$:Eu), CASN-based phosphors (e.g., $CaAlSiN_3$:Eu), SCASN-based phosphors (e.g., (Sr,Ca)$AlSiN_3$:Eu), and the like, and examples of fluoride-based phosphors include KSF-based phosphors (e.g., $K_2SiF_6$:Mn), KSAF-based phosphors (e.g., $K_2(Si,Al)F_6$:Mn), MGF-based phosphors (e.g., $3.5MgO.0.5MgF_2.GeO_2$:Mn), and the like. These phosphors in combination with the wavelength of the light from the light emitting element can produce a light emitting device having a desired emission color.

The light transmitting member 60, if disposed to cover the lower face of the substrate 11 of the light emitting element 10A, can be bonded via an adhesive. For the adhesive, for example, a resin having light transmissivity, such as epoxy or silicone, can be used. The light transmitting member 60 and the lower face of the substrate 11 of the light emitting element 10A can be bonded by a direct bonding method, such as surface activated bonding, atomic diffusion bonding, hydroxyl group bonding, or the like.

Light Emitting Device 100B

Figure 5A:
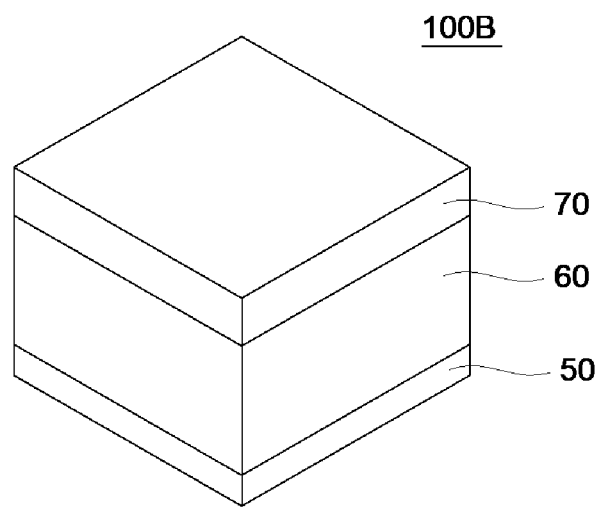
FIG. 5A is a schematic perspective view of a light emitting device which uses a light emitting element according to an embodiment of the present invention.
Figure 5B:
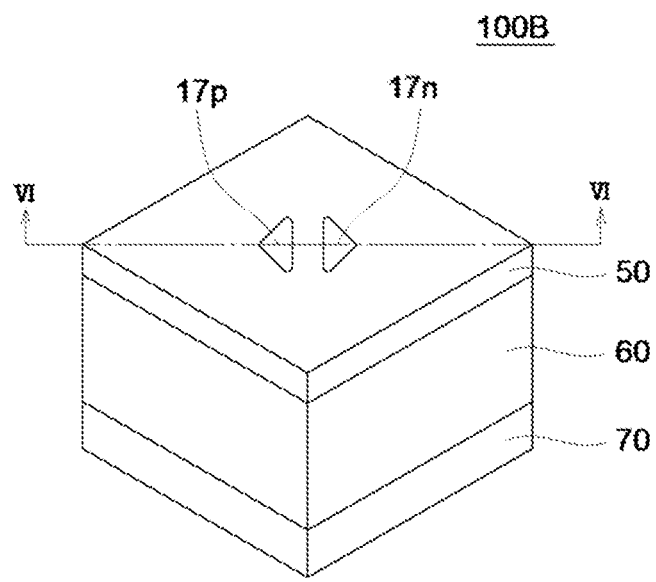
FIG. 5B is a schematic perspective view of a light emitting device which uses a light emitting element according to an embodiment of the present invention.

A light emitting device 100B employing a light emitting element 10A will be explained with reference to FIG. 5A, FIG. 5B, and FIG. 6. FIG. 5A and FIG. 5B are perspective views of the light emitting device 100B. The cross-sectional view in FIG. 6 is a schematic representation of the cross section taken along line VI-VI in FIG. 5B.

Figure 6:
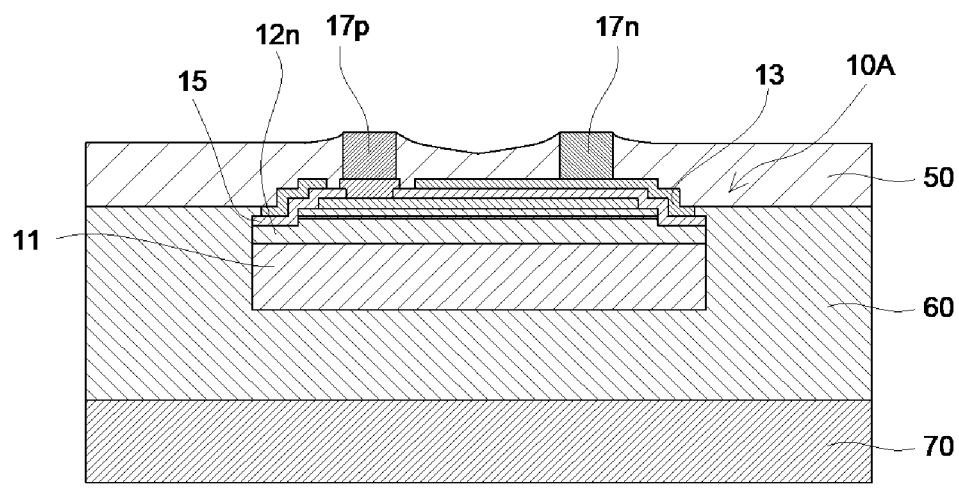
FIG. 6 is a schematic cross-sectional view taken along line VI-VI in FIG. 5B.

The light emitting device 100B employing a light emitting element 10A, as shown in FIG. 5A, 5B, and FIG. 6, primarily differs from the light emitting device 100A in terms of the arrangement of the first reflecting member 50, the light transmitting member 60, and the second reflecting member 70, in addition to not having a cover member 40. In the description below, the same reference numerals denote the same constituents as those of the light emitting device 100A shown in FIG. 3A, FIG. 3B, and FIG. 4 for which the explanation will be omitted.

The light emitting device 100B has a light emitting element 10A, a first reflecting member 50 covering a portion of the upper face of the light emitting element 10A, a light transmitting member 60 covering the lateral faces and the lower face of the substrate 11 of the light emitting element 10A, and a second reflecting member 70 disposed on the lower face of the light transmitting member 60.

The first reflecting member 50, as shown in FIG. 6, covers a portion of the upper face of the light emitting element 10A and the upper face of the light transmitting member 60. The first reflecting member 50 is not disposed on the lateral faces or the lower face of the substrate 11. The first reflecting member 50 is disposed so as not to cover the lateral faces of the first semiconductor layer 12n, the lateral faces or the lower face of the substrate 11. This allows the first reflecting member 50 to reflect the emitted light from the light emitting element 10A advancing towards the first reflecting member towards the light transmitting member 60, efficiently allowing the emitted light from the light emitting element 10A to become incident on the light transmitting member 60. The upper face of the first reflecting member 50 is positioned lower than the upper faces of the first external connection part 17n and the second external connection part 17p. The portion of the upper face of the first reflecting member 50 located between the first external connection part 17n and the second external connection part 17p is positioned lower than the upper face of the first reflecting member 50 located elsewhere.

The light transmitting member 60 is disposed on the lateral faces of the first semiconductor layer 12n, the lateral faces and the lower face of the substrate 11. A portion of the emitted light from the light emitting element 10A is extracted from the lateral faces of the light transmitting member 60.

Second Reflecting Member 70

A second reflecting member 70 is disposed on the lower face of the light transmitting member 60. The light transmitting member 60 is disposed between the first reflecting member 50 and the second reflecting member 70. For the second reflecting member 70, a similar material to that for the first reflecting member 50 described earlier can be used.

Certain embodiments of light emitting elements and light emitting devices according to the present invention have been specifically explained above. However, the subject matter of the present invention is not limited to the described embodiments, and should be broadly interpreted based on the scope of claims. Needless to say, various changes and modifications made based on the description are encompassed within the subject matter of the present invention.

What is claimed is:

1. A light emitting element comprising:
   a semiconductor stack structure comprising:
      a first semiconductor layer of a first conductivity type, wherein, in a top plan view, the first semiconductor layer has a first portion, and a second portion positioned within the first portion, and wherein, in a top plan view, the first semiconductor layer has a quadrangular shape including a first side, a second side connected to the first side, a third side connected to the second side, and a fourth side connected to the first and third sides,
      a second semiconductor layer of a second conductivity type disposed on the second portion, and
      an active layer disposed between the first semiconductor layer and the second semiconductor layer,
      wherein the first portion has a peripheral portion positioned at a periphery of the second portion, and exactly four extended portions, which are a first extended portion opposing the first side, a second extended portion opposing the second side, a third extended portion opposing the third side, and a fourth extended portion opposing the fourth side, wherein each extended portion extends from the peripheral portion towards the second portion in a top plan view;
   an insulation layer covering the semiconductor stack structure and having first through holes individually positioned in the extended portions and a second through hole positioned above the second semiconductor layer;
   a first electrode disposed on the second semiconductor layer via the insulation layer and electrically connected to the first semiconductor layer at the first through holes;
   a second electrode electrically connected to the second semiconductor layer at the second through hole;
   a first external connection part disposed on the first electrode positioned above the second semiconductor layer and electrically connected to the first electrode; and
   a second external connection part disposed on the second electrode and electrically connected to the second electrode; wherein:
   in a top plan view, the second semiconductor layer includes four regions defined by two imaginary lines, a first imaginary line being orthogonal to and halving the first side and a second imaginary line being orthogonal to and halving the second side;
   the four regions include:
      a first region in which the first external connection part is disposed,
      a second region adjacent to the first region in a first direction parallel to the second side,
      a third region adjacent to the first region in a second direction parallel to the first side, and
      a fourth region adjacent to the second region in the second direction, in which the second external connection part is disposed;
   the first and third extended portions are positioned on the first imaginary line; and
   the second and fourth extended portions are positioned on the second imaginary line.

2. The light emitting element according to claim 1, wherein:
   the first external connection part and the second external connection part are not aligned in the first direction.

3. The light emitting element according to claim 1, wherein:
   a light reflecting electrode is provided on the upper face of the second semiconductor layer; and
   the second electrode is electrically connected to the light reflecting electrode.

4. The light emitting element according to claim 2, wherein:
   a light reflecting electrode is provided on the upper face of the second semiconductor layer; and
   the second electrode is electrically connected to the light reflecting electrode.

5. The light emitting element according to claim 1, wherein:
   a length of a side of the first semiconductor layer is in a range of 100 μm to 500 μm.

6. The light emitting element according to claim 2, wherein:
   a length of a side of the first semiconductor layer is in a range of 100 μm to 500 μm.

7. The light emitting element according to claim 1, wherein:
   in a top plan view, at least 90% of the first external connection part is disposed in the first region; and
   in a top plan view, at least 90% of the second external connection part is disposed in the fourth region.

8. The light emitting element according to claim 2, wherein:
   in a top plan view, at least 90% of the first external connection part is disposed in the first region; and
   in a top plan view, at least 90% of the second external connection part is disposed in the fourth region.

9. The light emitting element according to claim 3, wherein:
   in a top plan view, at least 90% of the first external connection part is disposed in the first region; and
   in a top plan view, at least 90% of the second external connection part is disposed in the fourth region.

10. The light emitting element according to claim 1, wherein:
    in a top plan view, an entirety of the first external connection part is disposed in the first region; and
    in a top plan view, an entirety of the second external connection part is disposed in the fourth region.

11. The light emitting element according to claim 2, wherein:
    in a top plan view, an entirety of the first external connection part is disposed in the first region; and
    in a top plan view, an entirety of the second external connection part is disposed in the fourth region.

12. The light emitting element according to claim 3, wherein:
    in a top plan view, an entirety of the first external connection part is disposed in the first region; and
    in a top plan view, an entirety of the second external connection part is disposed in the fourth region.

13. The light emitting element according to claim 1, wherein:
    the first electrode is electrically connected to the first semiconductor layer only at the extended portions.

14. The light emitting element according to claim 2, wherein:
    the first electrode is electrically connected to the first semiconductor layer only at the extended portions.

15. The light emitting element according to claim 1, wherein:
in a top plan view a shortest distance between the first external connection part and the second external connection part is in a range of 30% to 60% of a length of a side of the first semiconductor layer.

16. The light emitting element according to claim 2 wherein:
in a top plan view a shortest distance between the first external connection part and the second external connection part is in a range of 30% to 60% of a length of a side of the first semiconductor layer.

17. A light emitting element comprising:
a semiconductor stack structure comprising:
  a first semiconductor layer of a first conductivity type, wherein, in a top plan view, the first semiconductor layer has a first portion, and a second portion positioned within the first portion, and wherein, in a top plan view, the first semiconductor layer has a quadrangular shape including a first side, a second side connected to the first side, a third side connected to the second side, and a fourth side connected to the first and third sides,
  a second semiconductor layer of a second conductivity type disposed on the second portion, and
  an active layer disposed between the first semiconductor layer and the second semiconductor layer,
  wherein the first portion has a peripheral portion positioned at a periphery of the second portion, and a plurality of extended portions individually opposing the first side, the second side, the third side, and the fourth side, each extending from the peripheral portion towards the second portion in a top plan view;
an insulation layer covering the semiconductor stack structure and having first through holes individually positioned in the extended portions and a second through hole positioned above the second semiconductor layer;
a first electrode disposed on the second semiconductor layer via the insulation layer and electrically connected to the first semiconductor layer only at the first through holes positioned in the extended portions;
a second electrode electrically connected to the second semiconductor layer at the second through hole;
a first external connection part disposed on the first electrode positioned above the second semiconductor layer and electrically connected to the first electrode; and
a second external connection part disposed on the second electrode and electrically connected to the second electrode; wherein:
in a top plan view, the second semiconductor layer includes four regions defined by two imaginary lines, a first imaginary line being orthogonal to and halving the first side and a second imaginary line being orthogonal to and halving the second side; and
the four regions include:
  a first region in which the first external connection part is disposed,
  a second region adjacent to the first region in a first direction parallel to the second side,
  a third region adjacent to the first region in a second direction parallel to the first side, and
  a fourth region adjacent to the second region in the second direction, in which the second external connection part is disposed.

* * * * *